(12) United States Patent
Kim

(10) Patent No.: US 10,438,681 B2
(45) Date of Patent: Oct. 8, 2019

(54) TEST STRUCTURES AND TEST PADS IN SCRIBE LANE OF SEMICONDUCTOR INTEGRATED CIRCUIT

(71) Applicant: SK hynix Inc., Icheon-si, Gyeonggi-do (KR)

(72) Inventor: Kwi Dong Kim, Incheon (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/840,651

(22) Filed: Dec. 13, 2017

(65) Prior Publication Data

US 2018/0294043 A1 Oct. 11, 2018

(30) Foreign Application Priority Data

Apr. 5, 2017 (KR) .................. 10-2017-0044385

(51) Int. Cl.

| G11C 29/38 | (2006.01) |
|---|---|
| H01L 27/115 | (2017.01) |
| G11C 29/12 | (2006.01) |
| G11C 29/48 | (2006.01) |
| H01L 21/66 | (2006.01) |
| H01L 23/544 | (2006.01) |
| H01L 27/112 | (2006.01) |

(52) U.S. Cl.
CPC .......... *G11C 29/38* (2013.01); *G11C 29/1201* (2013.01); *G11C 29/48* (2013.01); *H01L 27/115* (2013.01); *H01L 22/32* (2013.01); *H01L 23/544* (2013.01); *H01L 27/11206* (2013.01); *H01L 2223/5446* (2013.01); *H01L 2223/54426* (2013.01)

(58) Field of Classification Search
CPC ..... G11C 29/38; G11C 29/1201; G11C 29/48; H01L 23/544; H01L 27/115
See application file for complete search history.

(56) References Cited

U.S. PATENT DOCUMENTS

| 5,808,947 | A | * | 9/1998 | McClure | ................ | G01R 31/30 |
|---|---|---|---|---|---|---|
| | | | | | | 365/189.05 |
| 6,324,088 | B1 | * | 11/2001 | Keeth | .................... | G11C 5/025 |
| | | | | | | 365/51 |
| 6,963,511 | B2 | * | 11/2005 | Ashizawa | ......... | H01L 27/10897 |
| | | | | | | 365/200 |
| 2004/0085796 | A1 | * | 5/2004 | Tatsumi | ................. | G11C 29/12 |
| | | | | | | 365/63 |
| 2005/0111272 | A1 | * | 5/2005 | Hong | ..................... | G11C 29/50 |
| | | | | | | 365/201 |

(Continued)

FOREIGN PATENT DOCUMENTS

KR 101094945 B1 12/2011

*Primary Examiner* — Mushfique Siddique
(74) *Attorney, Agent, or Firm* — William Park & Associates Ltd.

(57) ABSTRACT

A semiconductor integrated circuit device may include a plurality of semiconductor chips, a scribe lane, connecting wiring, and a selection circuit. Each of the semiconductor chips may include a peripheral circuit. The scribe lane may be positioned between the semiconductor chips. A test pad may be arranged in the scribe lane. The connecting wiring may be connected between the test pad and the peripheral circuit. The selection circuit may be configured to selectively connect or disconnect the connecting wiring.

15 Claims, 7 Drawing Sheets

(56) References Cited

U.S. PATENT DOCUMENTS

| | | | |
|---|---|---|---|
| 2007/0200585 A1* | 8/2007 | Takeuchi | G01R 31/2884 |
| | | | 324/750.3 |
| 2009/0067278 A1* | 3/2009 | Choi | G11C 7/1051 |
| | | | 365/230.06 |
| 2009/0121733 A1* | 5/2009 | Choi | G01R 1/36 |
| | | | 324/762.01 |
| 2010/0220519 A1* | 9/2010 | Kim | G11C 29/02 |
| | | | 365/163 |
| 2011/0156736 A1* | 6/2011 | Yun | H01L 22/34 |
| | | | 324/754.03 |
| 2014/0003170 A1* | 1/2014 | Ku | G11C 29/00 |
| | | | 365/193 |
| 2015/0123698 A1* | 5/2015 | Shin | G01R 31/318513 |
| | | | 324/762.03 |
| 2017/0170081 A1* | 6/2017 | Byun | G01R 31/318511 |

\* cited by examiner

TEST STRUCTURES AND TEST PADS IN SCRIBE LANE OF SEMICONDUCTOR INTEGRATED CIRCUIT

CROSS-REFERENCES TO RELATED APPLICATION

The present application claims priority under 35 U.S.C. § 119(a) to Korean application number 10-2017-0044385, filed on Apr. 5, 2017, in the Korean Intellectual Property Office, which is incorporated herein by reference in its entirety.

BACKGROUND

1. Technical Field

Various embodiments generally relate to a semiconductor integrated circuit device, and more particularly to a semiconductor integrated circuit device including test pads.

2. Related Art

Generally, a probe card may be used for testing a semiconductor integrated circuit device. The probe card may include a multi-layered substrate and a plurality of test pins. A test pattern may be formed in the multi-layered substrate. The test pins may be arranged on the multi-layered substrate. The test pins may electrically contact with test pads on the semiconductor integrated circuit device. A test current generated from a tester may be applied to the test pads of the semiconductor integrated circuit device through the test pins to perform a probe test.

SUMMARY

In an embodiment, a semiconductor integrated circuit device may include a plurality of semiconductor chips, a scribe lane, a connecting wiring, and a selection circuit. Each of the semiconductor chips may include a peripheral circuit. The scribe lane may be positioned between the semiconductor chips. A test pad may be arranged in the scribe lane. The connecting wiring may be connected between the test pad and the peripheral circuit. The selection circuit may be configured to selectively connect or disconnect the connecting wiring.

In an embodiment, a semiconductor integrated circuit device may include a plurality of semiconductor chip regions, a scribe lane, a peripheral circuit, at least one test pad, and a selection circuit. The semiconductor chip regions may include a memory bank region and a peripheral circuit region. The scribe lane may be positioned at outskirts of each of the semiconductor chip regions. The peripheral circuit region may be arranged in the peripheral circuit region. The at least one test pad may be arranged in the scribe lane. The selection circuit may be configured to selectively connect the test pad with the peripheral circuit.

DETAILED DESCRIPTION

Figure 1:
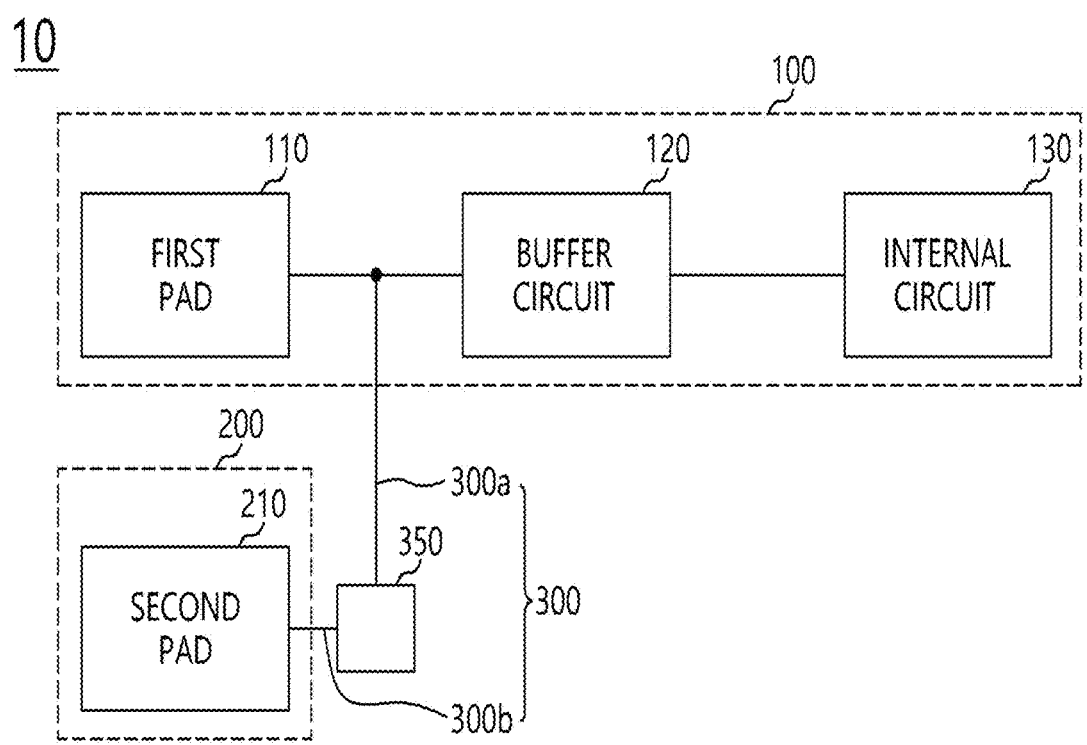
FIG. 1 is a block diagram illustrating a semiconductor integrated circuit device in accordance with example embodiments.

Various example embodiments will be described hereinafter with reference to the accompanying drawings, in which some example embodiments are illustrated. The embodiments may, however, be embodied in many different forms and should not be construed as limited to the example embodiments set forth herein. Rather, these example embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to," or "coupled to" another element or layer, the element can be directly on, connected, or coupled to the other element or layer or intervening elements or layers may be present. In contrast, when an element is referred to as being "directly on," "directly connected to," or "directly coupled to" another element or layer, there are no intervening elements or layers present. Like numerals refer to like elements throughout. As used herein, the term "and/or" includes any and all combinations of one or more of the associated listed items.

Hereinafter, example embodiments will be described below with reference to the accompanying drawings through various example embodiments.

FIG. 1 is a block diagram illustrating a semiconductor integrated circuit device in accordance with example embodiments.

Referring to FIG. 1, a semiconductor integrated circuit device of this example embodiment may include a first circuit 100 and a second circuit 200.

The first circuit 100 may be arranged in a semiconductor chip region. The first circuit 100 may include a first pad 110, a buffer circuit 120, and an internal circuit 130.

There may be at least one first pad 110. The first pad 110 may include an input pad or an output pad such as a normal address pad, a normal power pad, a normal data pad, etc.

The buffer circuit 120 may be connected with the first pad 110. The buffer circuit 120 may be configured to buffer a signal or a voltage inputted into the first pad 110. The buffer circuit 120 may provide the internal circuit 130 with a buffered signal or a buffered voltage. Further, the buffer circuit 120 may be configured to buffer a signal or a voltage provided from the internal circuit 130. The buffer circuit 120 may provide the first pad 110 with the buffered signal or the buffered voltage.

The internal circuit 130 may include circuit blocks configured to drive a semiconductor memory device.

The first pad 110, the buffer circuit 120, and the internal circuit 130 may be positioned in a peripheral circuit region of a semiconductor chip. Thus, the first circuit 100 may correspond to a peripheral circuit in a peripheral region.

The second circuit 200 may include a second pad 210. Although not depicted in FIG. 1, the second circuit 200 may include a plurality of test patterns electrically connected with the second pad 210.

The second pad 210 may be positioned in a scribe lane at an outskirt, fringe, or edge of the semiconductor chip. The second pad 210 may include a test pad with which a probe card may make contact. The second pad 210 may be connected with the first pad 110, the buffer circuit 120, and the internal circuit 130. The second pad 210 may be configured to transmit a signal from the second pad 210 to the first pad 110 or the internal circuit 130.

The second pad 210 may be electrically connected with the first pad 110, or the second pad 210 and the internal circuit 130 may be electrically connected with each other through a connecting wiring 300.

A selection circuit 350 may be connected with and arranged on the connecting wiring 300. Thus, the selection circuit 350 may be configured to selectively disconnect, separate, or in other words create an opening between a connecting wiring portion (hereinafter, referred to as a first connecting wiring portion 300a) connected to the first circuit 100 and a connecting wiring portion (hereinafter, referred to as a second connecting wiring portion 300b) connected to the second circuit 200. For example, during a probe test, the selection circuit 350 may connect the first connecting wiring portion 300a with the second connecting wiring portion 300b to form a single conductive path. In contrast, during a normal operation, the selection circuit 350 may disconnect the first connecting wiring portion 300a from the second connecting wiring portion 300b. Therefore, the first connecting wiring portion 300a and the second connecting wiring portion 300b may be converted into a floating state or a non-conductive state to prevent the first connection wiring portion 300a and the second connecting wiring portion 300b from being used as a loading resistance.

Figure 2:
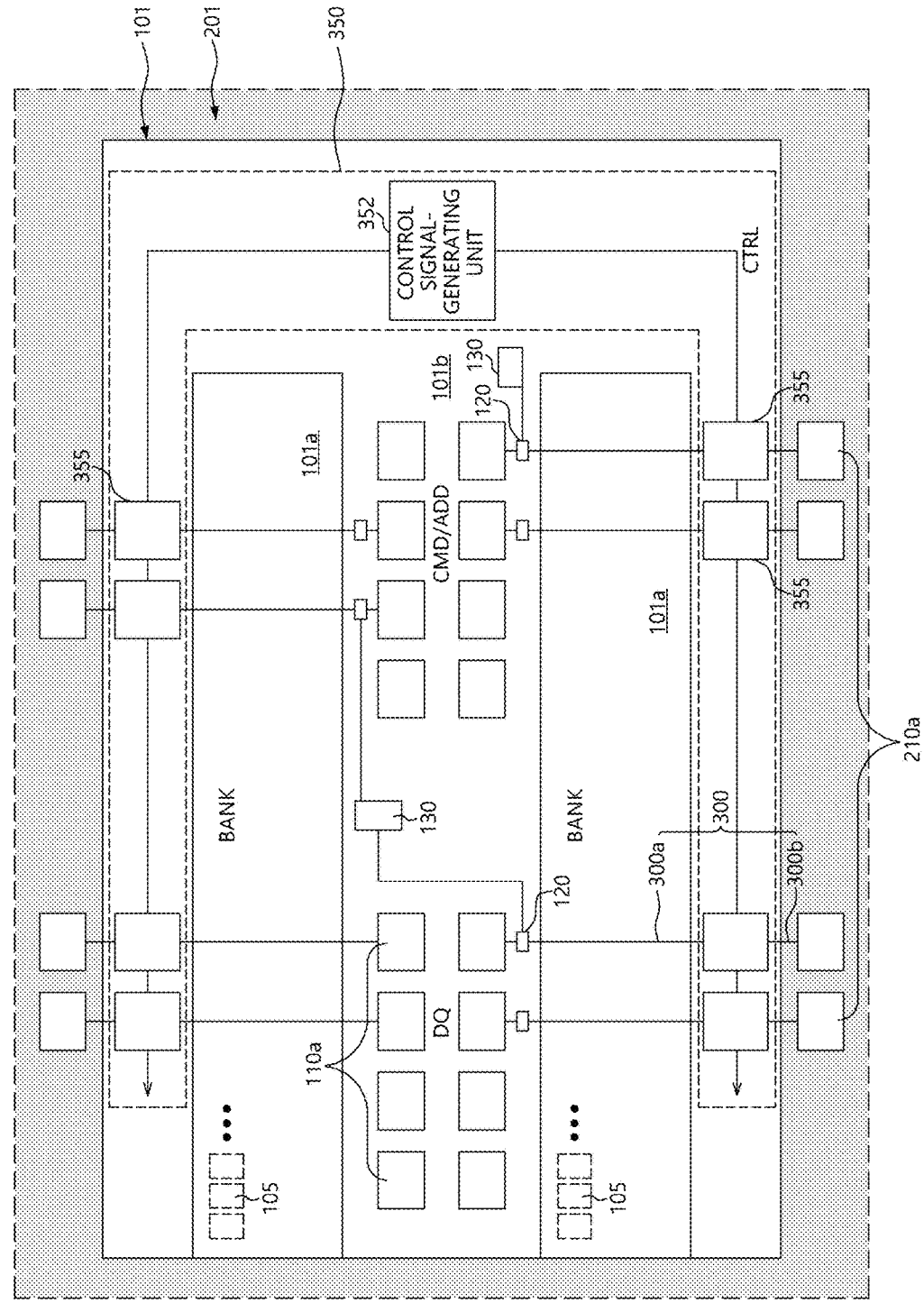
FIG. 2 is a plan view illustrating a semiconductor integrated circuit device in accordance with example embodiments.

FIG. 2 is a plan view illustrating a semiconductor integrated circuit device in accordance with example embodiments.

Referring to FIG. 2, a semiconductor integrated circuit device 10 may include a semiconductor chip 101 and a scribe lane 201 configured to surround the semiconductor chip 101.

The first circuit 100 in FIG. 1 may correspond to a circuit in the semiconductor chip 101. The second circuit 200 in FIG. 1 may correspond to a circuit in the scribe lane 201.

The semiconductor chip 101 may include a memory bank region 101a and a peripheral circuit region 101b. The memory bank region 101a may include a plurality of memory cells 105. The peripheral circuit region 101b may include control circuits such as the first pad 110, the buffer circuit 120, and the internal circuit 130 configured to control the memory cells 105. The peripheral circuit region 101b may be arranged in a position separated from the memory bank region 101a. Further, the memory bank region 101a may be arranged at both sides of the peripheral circuit region 101b.

The scribe lane 201 may correspond to the outer region of the semiconductor chip 101 along which a wafer may be sawed to form the semiconductor chip 101. The scribe lane 201 may have a uniform width. Various patterns such as test patterns, alignment keys, etc., may be arranged in the scribe lane 201.

Normal pads 110a corresponding to the first pad 110 in FIG. 1 may be arranged in the peripheral circuit region 101b. The peripheral circuit region 101b may include the normal pads 110a and the internal circuit 130 which may be electrically connected with the normal pads 110a. The normal pads 110a may selectively receive commands, data, power, addresses, etc., from an external device. The normal pads 110a may selectively provide an input terminal of the internal circuit 130 and a signal line of the memory bank region 101a with the commands, the data, the power, the addresses, etc. Further, the normal pads 110a may receive signals outputted from the memory bank region 101a. The normal pads 110a may output the signals to the external device.

The buffer circuit 120 and the internal circuit 130 may be arranged in the peripheral circuit region 101b. The buffer circuit 120 may correspond to the normal pads 110a, respectively. The buffer circuit 120 may include circuits configured to stabilize a voltage. Further, the buffer circuit 120 may include an electrostatic discharge circuit.

Test pads 210a corresponding to the second pad 210 in FIG. 1 may be arranged in the scribe lane 201. Particularly, the test pads 210a may be positioned in the scribe lane 201, not the peripheral circuit region 101b. The test pads 210a may be separated from the normal pads 110a so that a pattern margin of the peripheral circuit region 101b may be improved. Further, because the test pads 210a may be formed in the scribe lane 201 which has a large area, the test pads 210 may be arranged in different ways. As a result, a sufficient gap between test pins of the probe card making contact with the test pads 210a may be ensured.

A connecting wiring 300 may be configured to connect the test pad 210a with at least one of the normal pad 110a, the buffer circuit 120, and the internal circuit 130. The number of the connecting wirings 300 may correspond to the number of the test pads 210a. In this example embodiment, the connecting wiring 300 may be configured to connect the test pad 210a with the buffer circuit 120.

The connecting wiring 300 may extend over the memory bank region 101a to provide the connecting wiring 300 with the shortest length. The connecting wiring 300 may be positioned at an uppermost region of the memory bank region 101a to prevent an electrical short between the connecting wiring 300 and a wiring in the memory bank region 101a.

A selection circuit 350 may be connected with the connecting wiring 300. The selection circuit 350 may connect the first connecting wiring portion 300a with the second connecting wiring portion 300b or disconnect the first connecting wiring portion 300a from the second connecting wiring portion 300b.

The selection circuit 350 may include a control signal-generating unit 352 and a switching unit 355. The control signal-generating unit 352 may generate a control signal CTRL for driving and controlling operations of the switching unit 355. The control signal-generating unit 352 may include a non-volatile memory device such as a laser fuse, an e-fuse, etc.

The control signal-generating unit 352 may generate the control signal CTRL for driving the switching unit 355 in accordance with a fuse cutting or a rupture.

The switching unit 355 may correspond to the connecting wirings 300 in one-to-one relation. The switching unit 355 may be driven in response to the control signal CTRL to provide the connecting wiring 300 with the single conductive path or the two connecting wiring portions.

Figure 3:
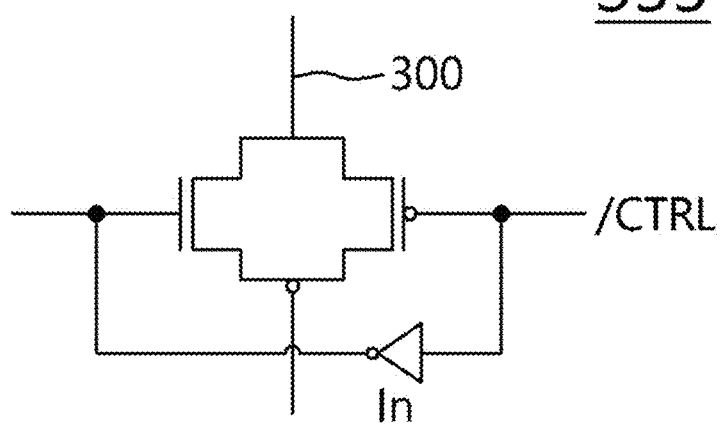
FIG. 3 is a circuit diagram illustrating a switching unit in accordance with example embodiments.

FIG. 3 is a circuit diagram illustrating a switching unit in accordance with example embodiments.

Referring to FIG. 3, the switching unit 355 may include a transfer gate driven in response to the control signal CTRL. The transfer gate may include an NMOS transistor and a PMOS transistor. An inverter In may be arranged between a gate of the NMOS transistor and a gate of the PMOS transistor. Voltages having opposite levels may be applied to the gates of the NMOS transistor and the PMOS transistor.

When a test mode indicates that a test operation is performed, the control signal-generating unit 352 may output the control signal CTRL enabled to a low level by a general fuse operation. The control signal CTRL may be inputted into the switching unit 355 to form a conductive path connection between the test pad 210a and at least one of the normal pad 110a, the buffer circuit 120, and the internal circuit 130. In other words, the switching unit 355 may connect the connecting wiring 300 to electrically connect the test pad 210a with the first circuit 100 in the test mode.

When the normal operation is performed, the control signal-generating unit 352 may output the control signal CTRL disabled to a high level. The switching unit 355 may be turned-off to disconnect the first connecting wiring portion 300a from the second connecting wiring portion 300b. Thus, during the normal operation, the signal of the test pad 210a may possibly not be transmitted to the circuit of the peripheral circuit region 101b so that the first connecting wiring portion 300a and the second connecting wiring portion 300b may be floated. In other words, the switching unit 355 may separate the connecting wiring 300 to electrically disconnect the test pad 210a from the first circuit 100 in a normal mode.

Figure 4:
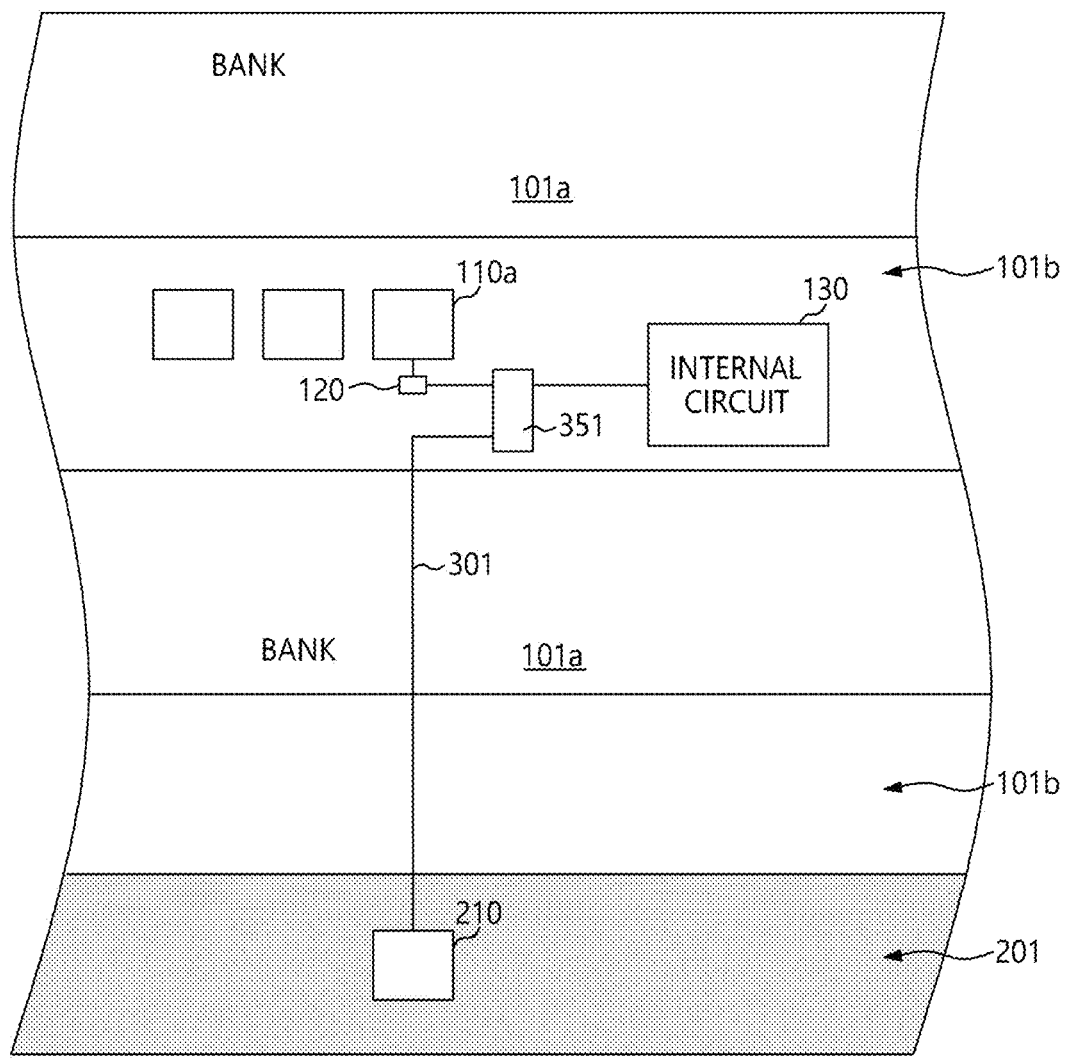
FIG. 4 is a plan view illustrating a semiconductor integrated circuit device including a test pad and an internal circuit connected with each other through a connecting wiring in accordance with example embodiments.
Figure 5:
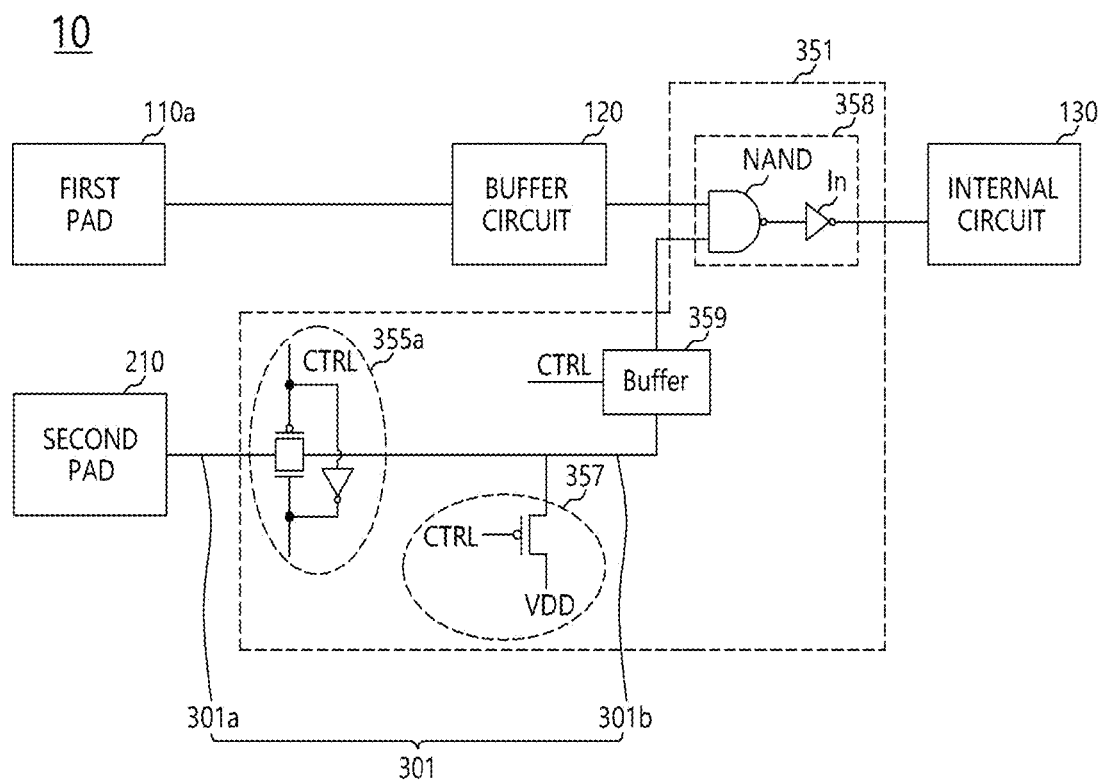
FIG. 5 is a circuit diagram illustrating a semiconductor integrated circuit device including a test pad and an internal circuit connected with each other through connecting wiring in accordance with example embodiments.

FIG. 4 is a plan view illustrating a semiconductor integrated circuit device including a test pad and an internal circuit connected with each other through a connecting wiring in accordance with example embodiments, and FIG. 5 is a circuit diagram illustrating a semiconductor integrated circuit device including a test pad and an internal circuit connected with each other through a connecting wiring in accordance with example embodiments.

Referring to FIG. 4, a connecting wiring 301 may be configured to connect the test pad 210 in the scribe lane 201 with the internal circuit 130. A selection circuit 351 may be connected between the test pad 210 and the internal circuit 130 to provide the internal circuit 130 with the signal or the voltage of the test pad 210. In example embodiments, the selection circuit 351 may be arranged in the peripheral circuit region 101b between the memory bank regions 101a. Alternatively, the selection circuit 351 may be arranged at other positions.

Referring to FIG. 5, the selection circuit 351 may include a switching unit 355a, a pre-charging unit 357, a signal-maintaining unit 358, and a buffering unit 359.

The switching unit 355a may include a transfer gate driven in response to a control signal CTRL. The switching unit 355a may have configurations substantially the same as those of the switching unit 355 of FIG. 3. The switching unit 355a may be arranged such that one switching unit corresponds to each of the connecting wirings 301.

The pre-charging unit 357 may include a PMOS transistor configured to pre-charge a driving voltage VDD in the connecting wiring 301 in response to a reversed control signal /CTRL. In one example, the pre-charging unit 357 may pre-charge the connecting wiring 301 with the driving voltage VDD when the connecting wiring 301 is separated from the test pad 210. The NAND gate NAND may perform a NAND arithmetic operation with an output signal of the buffer circuit 120 and a voltage applied to the connecting wiring 301 passing through the normal pad 110a. An inverter In may reverse an output voltage of the NAND gate. The inverter In may provide the internal circuit 130 with a reversed output voltage.

The buffering unit 359 may be connected between the pre-charging unit 357 and the NAND gate NAND. The buffering unit 359 may be configured to buffer a signal of the second connecting wiring portion 301b passing through the pre-charging unit 357. For example, the buffering unit 359 may include a CMOS inverter chain configured to buffer the signal of the second connecting wiring portion 301b in response to the control signal CTRL.

When a test operation is performed, the control signal-generating unit 352 (see FIG. 2) may output a control signal having a low level. The switching unit 355a may be turned-on in response to the low control signal CTRL. Thus, the signal or the voltage of the second pad 210 may be transmitted to the internal circuit 130 through the switching unit 355a and the signal-maintaining unit 358. In other words, the signal-maintaining unit 358 may transmit the signal or voltage of the second pad 210 to the internal circuit 130 in the test mode.

When the normal operation is performed, the control signal CTRL may be disabled to the high level. Thus, the switching unit 355a may be turned-off so that the first connecting wiring portion 301a may be disconnected from the second connecting wiring portion 301b connected to the internal circuit 130. The pre-charging unit 357 to which the reversed control signal /CTRL may be applied may be driven so that the second connecting wiring portion 301b may be pre-charged to the driving voltage level. The signal of the second connecting wiring portion 301b having the driving voltage level may be additionally buffered by the buffering unit 359 so that a normally high signal may be inputted into the NAND gate NAND of the signal-maintaining unit 358. Because a normally high signal may be applied to the NAND gate NAND, a signal of the normal pad 110a may be transmitted to the internal circuit 130 through the buffer circuit 120 and the signal-maintaining unit 358 without a change in the level of the signal. In other words, the signal-maintaining unit 358 may transmit the signal of the normal pad 110a to the internal circuit 130 in the normal mode. Therefore, the pre-charged second connecting wiring portion 301b having the driving voltage level may embody a stable wiring and a low signal loading. In some embodiments, the buffering unit 359 may be omitted.

Figure 6:
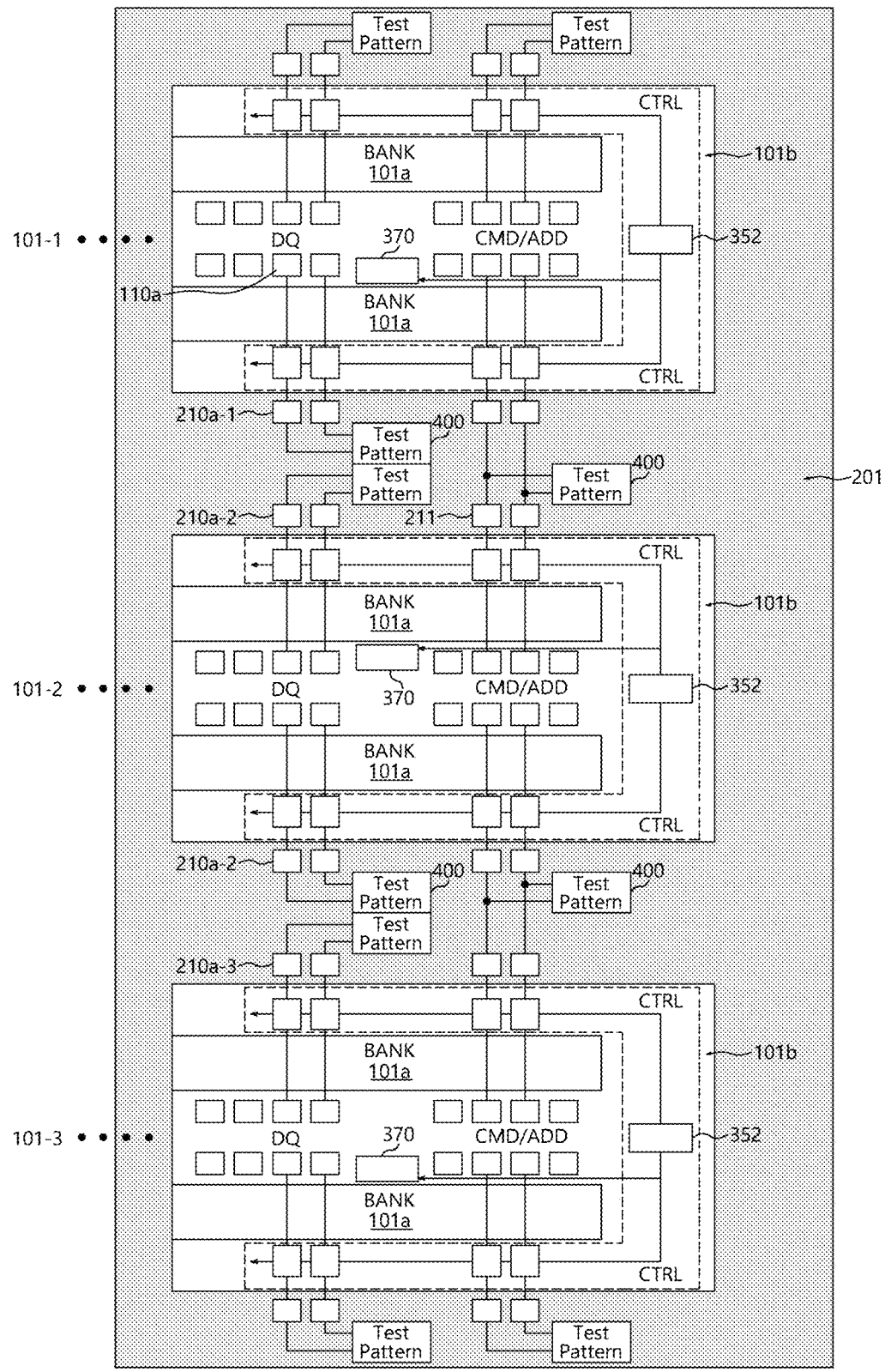
FIG. 6 is a plan view illustrating a plurality of semiconductor chips of a semiconductor integrated circuit device commonly including a test pad in accordance with example embodiments.

FIG. 6 is a plan view illustrating a plurality of semiconductor chips of a semiconductor integrated circuit device commonly including a test pad in accordance with example embodiments.

Referring to FIG. 6, a plurality of chips 101-1~101-3 may be divided by a scribe lane 201.

For example, a first test pad 210a-1 of the first chip 101-1 and a second test pad 210a-2 of the second chip 101-2 may be arranged in the scribe lane 201 between the first chip 101-1 and the second chip 101-2. The first pad 210a-1 may be connected between the first circuit 100 in FIG. 1 of the first chip 101-1 and the normal pad 110a in FIG. 2 or the internal circuit of the first chip 101-1 in FIG. 5. The second pad 210a-2 may be connected with the normal pad 110b or the internal circuit of the second chip 101-2. The first test pad 210a-1 and the second test pad 210a-2 may be electrically connected with a test pattern 400 which may be arranged in the scribe lane 201.

The test pads 210a-1 and 210a-2 may be arranged corresponding to the chips 101-1~101-2. Alternatively, the adjacent chips 101-1 and 101-2 or 101-2 and 101-3 may commonly have a test pad 211. For example, the test pad 211 may be used as a test pad of the first chip 101-1 or the second chip 101-2.

When two chips 101-1 and 101-2 or 101-2 and 101-3 commonly have a single test pad 211, influences between the test processes may be little because times of the test processes may be different. However, in order to accurately test the chips, the wafer probe test may be performed under a condition that a DQ input and an ODT operation of the chips 101-1~101-3 may be off. Reference numeral 370 may designate an output controller configured to reset a base setting of the chips 101-1~101-3 in accordance with the control signal CTRL provided from the control signal-generating unit 352.

The test pattern 400 in the scribe lane 201 may be commonly used for the adjacent chips 101-1 and 101-2 or 101-2 and 101-3. The test pattern 400 in the scribe lane 201 may be electrically connected with the test pad 211. Further, adjacent chips 101-1 and 101-2 or 101-2 and 101-3 at both sides of the scribe lane 201 may be connected in common with the test pattern 400.

According to example embodiments, the test pad may be arranged in the scribe lane to improve an integration degree of the peripheral circuit region. Further, the semiconductor chips may commonly have the test pad to reduce the number of test pins in the probe card. Therefore, the probe card may have a light weight so that a wafer stress caused by the weight of the probe card may be decreased.

Furthermore, the connecting wiring between the test pad and the peripheral circuit region may be selectively disconnected or pre-charged to reduce the wiring loading.

Figure 7:
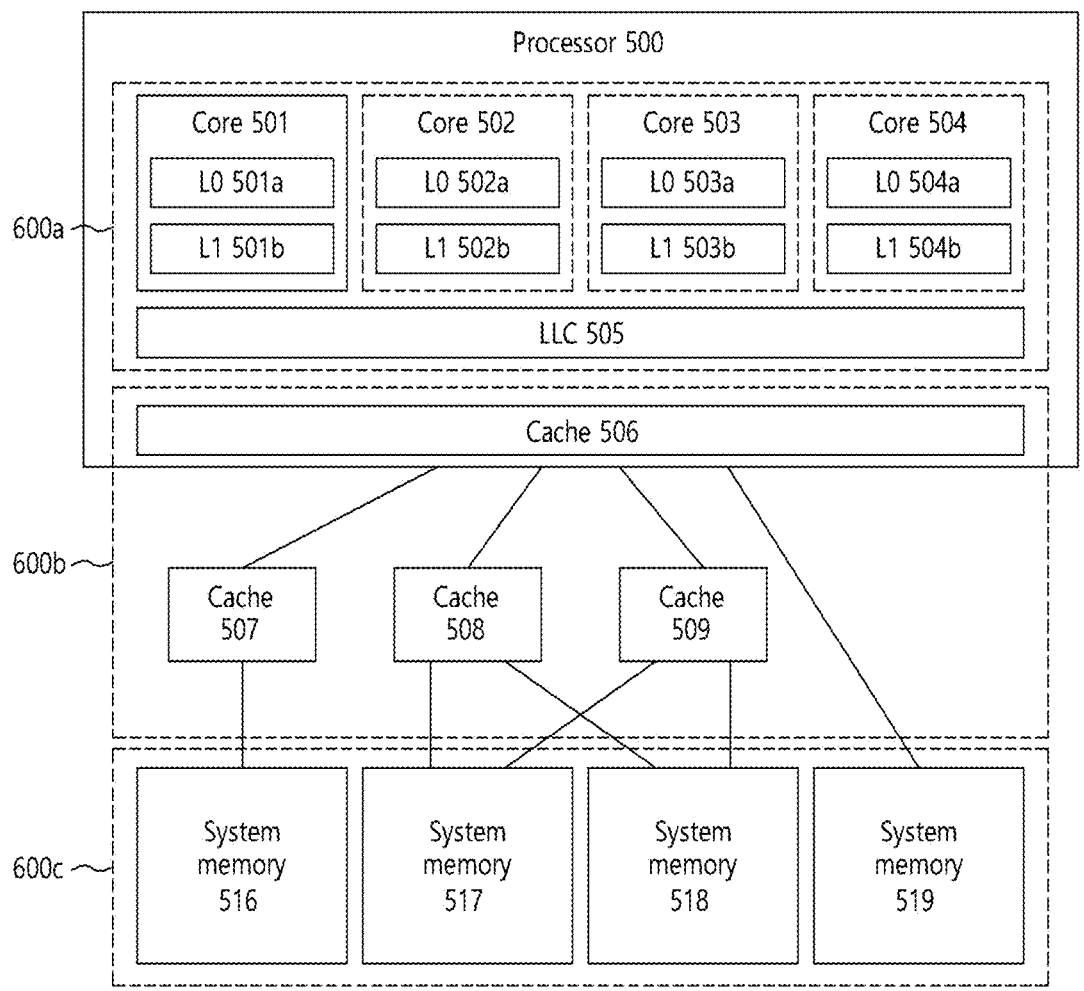
FIG. 7 is a block diagram illustrating a computer system in accordance with example embodiments

FIG. 7 is a block diagram illustrating a computer system in accordance with example embodiments.

Referring to FIG. 7, a computer system of this example embodiment may include a processor 500, a cache memory 507 to 509 and a plurality of system memories 516 to 519.

The processor 500 may include a plurality of cores 501 to 504. Each of the cores 501 to 504 may include upper level caches L0: 501a to 504a and middle level caches L1: 501b to 504b. The upper level caches L0: 501a to 504a and the middle level caches L1: 501b to 504b may be dedicated to the corresponding cores 501 to 504.

The processor 500 may include lower level caches LLC: 505 commonly shared with the cores 501 to 504. The processor 500 may further include a common cache 506 provided as a near memory.

A cache group may include a plurality of sub-caches 507 to 509. The cache group may be arranged between the processor 500 and the system memories 516 to 519. The sub-caches 507 to 509 may be operated to correspond to the system memories 516 to 519 divided by addresses. For example, the first sub-cache 507 may be used as a memory controller of the first system memory 516 corresponding to a first address section. The second sub-cache 508 may be used as a memory controller for controlling a non-overlapped portion between the second system memory 517 and the third system memory 518 corresponding to a second address section.

The system memories 516 to 519 may include a memory configured to be directly accessed by software activated on the processor 500. In contrast, the caches 501a to 509 may be aided by activations of commands of the cores 501 to 504 under the activation of the software. The system memories 516 to 519 may be manually operated as a part of the processor and/or automatically operated by the software.

The computer system may be interfaced with a dual in-line memory module (DIMM) as a storage device including the semiconductor integrated circuit device.

The DIMM and the computer system may use a DRAM channel such as a DDR3, DDR4, DDR5, etc., as an interface. Reference numerals 600a, 600b, and 600c may indicate a cache for an internal processor, a near memory operated as a remote memory cache, and a system memory, respectively.

The above embodiments of the present disclosure are illustrative and not initative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor memory device comprising:
   a plurality of semiconductor chips including a peripheral circuit and a plurality of memory banks;
   a scribe lane positioned between the semiconductor chips, a test pad arranged in the scribe lane;
   a connecting wiring connected between the test pad and the peripheral circuit;
   a selection circuit arranged on the connecting wiring to connect or separate the connecting wiring;
   a pre-charging unit configured to selectively pre-charge the connecting wiring with a voltage when the connecting wiring is separated from the test pad; and
   a plurality of test patterns arranged in the scribe lane and connected with the peripheral circuits of the semiconductor chips at both sides of the scribe lane in common.

2. The semiconductor memory device of claim 1, wherein each of the semiconductor chips comprises a peripheral circuit region arranged in the peripheral circuit, and a memory bank region being arranged at both sides of the peripheral circuit region and formed in the plurality of memory banks including a plurality of memory cells, and
   wherein the peripheral circuit region comprises a normal pad and an internal circuit electrically connected with the normal pad.

3. The semiconductor memory device of claim 2, wherein the connecting wiring is arranged at an uppermost region of the memory bank region.

4. The semiconductor memory device of claim 1, wherein the selection circuit is arranged in the peripheral circuit.

5. The semiconductor memory device of claim 1, wherein the selection circuit comprises a switching unit configured to connect the connecting wiring to electrically connect the test pad with the peripheral circuit in a test mode, and to separate the connecting wiring to electrically disconnect the test pad from the peripheral circuit in a normal mode.

6. The semiconductor memory device of claim 5, wherein the selection circuit further comprises a control signal-generating unit configured to generate a control signal for driving the switching unit, the control signal-generating unit including a non-volatile memory device.

7. The semiconductor memory device of claim 1, wherein the selection circuit comprises:
   a switching unit configured to connect the connecting wiring so as to electrically connect the test pad with the peripheral circuit in a test mode, and to separate the connecting wiring so as to electrically disconnect the test pad from the peripheral circuit in a normal mode, wherein the pre-charging unit is configured to be connected with an output of the switching unit and to pre-charge the connecting wiring with a voltage when the connecting wiring is separated from the test pad.

8. The semiconductor memory device of claim 1, wherein the selection circuit further comprises a signal-maintaining unit configured to receive a signal outputted from the pre-charging unit and a signal transmitted from the normal pad, and the signal-maintaining unit is configured to transmit the signal of the test pad to the internal circuit in a test mode and to transmit the signal of the normal pad to the internal circuit in a normal mode.

9. The semiconductor memory device of claim 1, further comprising the plurality of test patterns arranged in the scribe lane and electrically connected with the test pad.

10. A semiconductor memory device comprising:
a plurality of semiconductor chip regions including a memory bank region and a peripheral circuit region;
a scribe lane positioned at an edge of each of the semiconductor chips;
a peripheral circuit arranged in the peripheral circuit region;
at least one test pad arranged in the scribe lane;
connecting wirings arranged between the test pad and the peripheral circuit;
a selection circuit configured to be connected between the connecting wirings, the selection circuit including a switching unit for selectively connecting the test pad with the peripheral circuit; and
a pre-charging unit configured to selectively pre-charge the connecting wiring connected to an output of the selection circuit with a voltage when the test pad are separated from the peripheral circuit,
wherein the peripheral circuits of the semiconductor chips at both sides of the scribe lane are connected with test patterns in the scribe lane in common.

11. The semiconductor memory device of claim 10, wherein the connecting wiring is connected to the test pad in one-to-one relation.

12. The semiconductor memory device of claim 11, wherein the connecting wiring is arranged at an uppermost region of the memory bank region.

13. The semiconductor memory device of claim 11, wherein the selection circuit further comprises:
a control signal-generating unit configured to generate a control signal in accordance with a test mode,
wherein the switching unit configured to connect or disconnect the connecting wiring between the test pad and the peripheral circuit in response to the control signal.

14. The semiconductor memory device of claim 10, wherein the peripheral circuit comprises:
a normal pad;
a buffer circuit connected with the normal pad; and
an internal circuit configured to receive a signal outputted from the buffer circuit,
wherein the connecting wiring connected to the test pad is connected to at least one of the normal pad, the buffer circuit and the internal circuit.

15. The semiconductor memory device of claim 10, wherein the selection circuit further comprises a signal-maintaining unit configured to receive a signal outputted from the pre-charging unit and a signal transmitted from a normal pad, and the signal-maintaining unit is configured to transmit the signal of the test pad to an internal circuit in a test mode and to transmit the signal of the normal pad to the internal circuit in a normal mode.

* * * * *